(12) United States Patent
Um

(10) Patent No.: US 6,429,666 B1
(45) Date of Patent: Aug. 6, 2002

(54) CAPACITIVE CIRCUIT ARRAY FOR FINGERPRINT SENSING

(75) Inventor: Gregory S. Um, Torrance, CA (US)

(73) Assignee: Sentronics Corporation, Torrance, CA (US)

( * ) Notice: Subject to any disclaimer, the term of this patent is extended or adjusted under 35 U.S.C. 154(b) by 0 days.

(21) Appl. No.: 09/550,626

(22) Filed: Apr. 17, 2000

(51) Int. Cl.[7] ............................................... G01R 27/08
(52) U.S. Cl. ........................ 324/693; 341/33; 382/124
(58) Field of Search ............................... 324/693, 663, 324/686, 682, 688, 690, 421, 535; 382/124, 115, 116; 340/365.1; 204/416; 341/33

(56) References Cited

U.S. PATENT DOCUMENTS

| | | | | |
|---|---|---|---|---|
| 4,290,052 A | * | 9/1981 | Eichelberger | |
| 5,920,640 A | * | 7/1999 | Salatino | |
| 5,940,526 A | * | 8/1999 | Setlak | |
| 6,004,442 A | * | 12/1999 | Choulga | |
| 6,060,756 A | * | 5/2000 | Machida | |

* cited by examiner

Primary Examiner—Michael J. Sherry
Assistant Examiner—Trung Nguyen
(74) Attorney, Agent, or Firm—Irving Keschner

(57) ABSTRACT

A compact sensor which maps fingerprints for identification purposes. The sensor consists of an array of pixels with each pixel configured with one or more pickup conductive electrodes surrounded by voltage electrodes of different phases. This configuration performs capacitive differencing to eliminate the large background capacitance without the need for complex sensor circuitry. In addition, the readout lines are electrically shielded from the input voltage lines by an intermediate grounded conductive layer, thereby eliminating the parasitic capacitance and allowing the detection of minute capacitance variation of the finger surface.

4 Claims, 7 Drawing Sheets

CAPACITIVE CIRCUIT ARRAY FOR FINGERPRINT SENSING

BACKGROUND OF THE INVENTION

1. Field of the Invention

The present invention relates to two dimensional mapping of fingerprint patterns for identification purposes utilizing a capacitive circuit array.

2. Description of the Prior Art

Fingerprint sensing and the associated identification systems which include data bases and a match algorithm processor have been available in the prior art. In the area of the fingerprint sensor, the primary prior art systems utilize an optical scanning method which is relatively bulky and expensive due to the optics, lasers and the CCD array utilized. Due to this reason, there have been attempts to develop electronic means of sensing fingerprint patterns. All electronic fingerprint sensors can be categorized as follows; tactile pressure sensors, thermal sensors and capacitive sensors. The first two categories are complex and expensive to make, and thus most of recent development activities are in the area of capacitive sensors.

One group of capacitive sensors rely on thin deformable membranes with metal electrodes (one electrode per pixel) coated underneath each membrane. If the membrane is very thin and can follow the finger surface deformation, the distance of the metal electrodes can be measured through capacitance means. However, such thin membranes are not durable, and hence, are not yet marketable.

Another group of capacitive fingerprint sensors read the capacitance difference from the rigid sensor electrodes to the finger surface ridges directly without relying on membranes. In this case, the capacitance difference due to the finger surface variation is minute, with a typical order of a few fF (femto farad), and is imbedded in the larger background and parasitic capacitance from the sensor structure and the readout lines. Therefore, somewhat complex circuitry such as those disclosed by Tartagni et al. in an article entitled "Fingerprint Sensor Based on the Feedback Capacitive Sensing Scheme", IEEE Journal of Solid State Circuits, Vol. 33, p. 133 (January 1998) and U.S. Pat. No. 5,835,141 to Ackland et al. have been implemented to filter out the background capacitance. The circuitry utilized in Tartagni et al and Ackland et al involve several transistors, an amplifier or charge accumulation and transfers in every pixel, making the sensor array complex. The prior art all have one or two metal electrodes per pixel at the top most layer of the sensor.

What is thus desired is to provide a fingerprint sensor which maps fingerprints for identification purposes which is reliable, compact and is less expensive than existing fingerprint identification systems.

SUMMARY OF THE PRESENT INVENTION

The present invention utilizes sensor electrodes, having three or more metal electrodes/lines per pixel at the topmost layer of the sensor; at least two input voltage lines of different phases and one or more of sensor pickup electrodes. This combination nulls out the DC background capacitance and thus no electronic circuitry below the sensor electrodes is required. The sensor array can be manufactured without the need for expensive and slow vacuum systems such as CVD's (chemical vapor deposition) and diffusion machines, etc. In particular, the sensor array can be manufactured entirely on a low cost substrate, such as circuit boards, glass or ceramics, with thick/thin film processing methods requiring only 15–20 micron feature sizes. The array readout is achieved externally without requiring transistor switches or CCD's in the pixel itself making the sensor device very economical to manufacture.

BRIEF DESCRIPTION OF THE DRAWING

For better understanding of the present invention as well as other objects and further features thereof, reference is made to the following description which is to be read in conjunction with the accompanying drawing therein.

DESCRIPTION OF THE INVENTION

Figure 1:
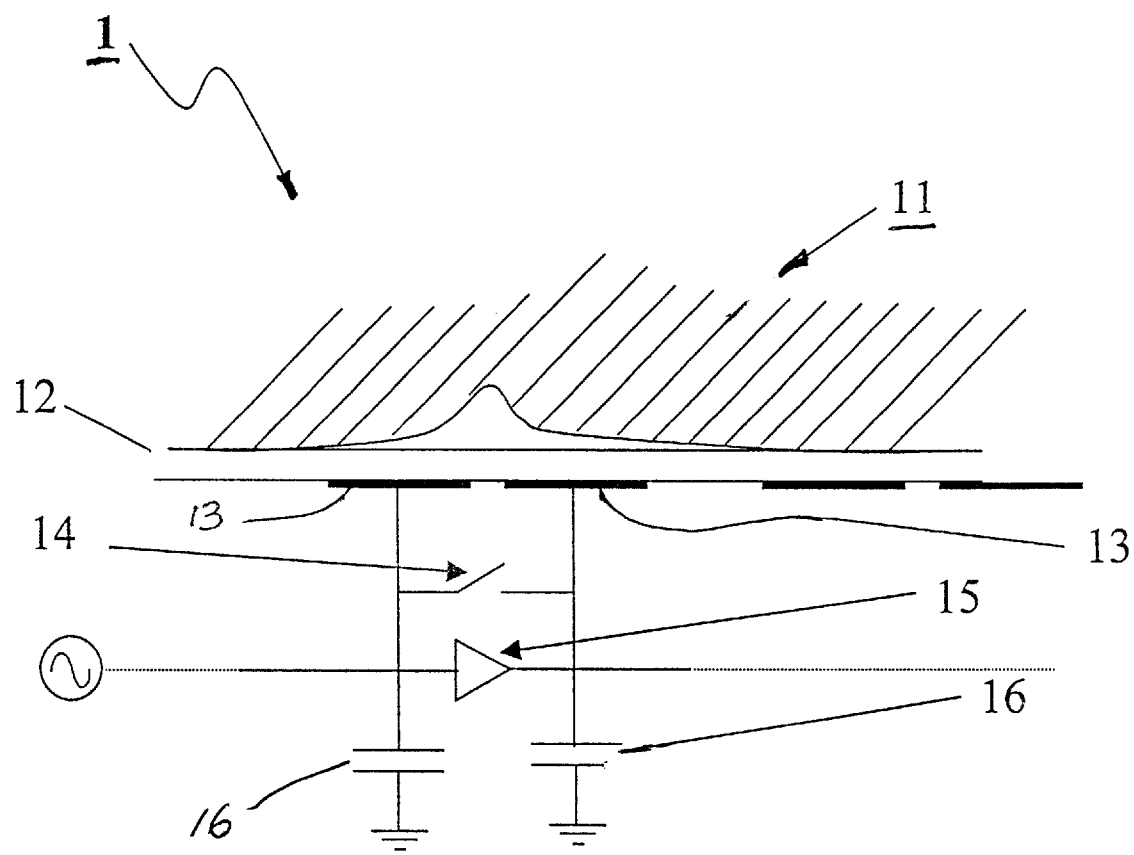
FIG. 1 illustrates a prior art fingerprint sensing device.

FIG. 1 illustrates a prior art fingerprint sensing device 1. The circuitry for each pixel (only one illustrated) comprises amplifier 15, switch 14 and two capacitors 16 (a pixel is defined as an elementary set of patterns which repeats in the array and consists of pick up voltage electrodes which are necessary to perform sensing of finger ridge lines at a point or at a small point-like region). The capacitive readout between the two pickup electrodes, or conductive layers, 13 is passed through the circuit to remove the large background and parasitic capacitance. A thin protective coating 12 is disposed between the pickup electrodes 13 and the finger 11. The circuitry requires fabrication of many transistors per pixel with sub-micron resolution processing which in turn requires expensive and slow semiconductor process equipment. In addition, the silicon wafer and other processing material costs are also high with a limited wafer size per process, yielding relatively small numbers of sensor dies which must be of approximate size 1×1 inch.

Figure 2:
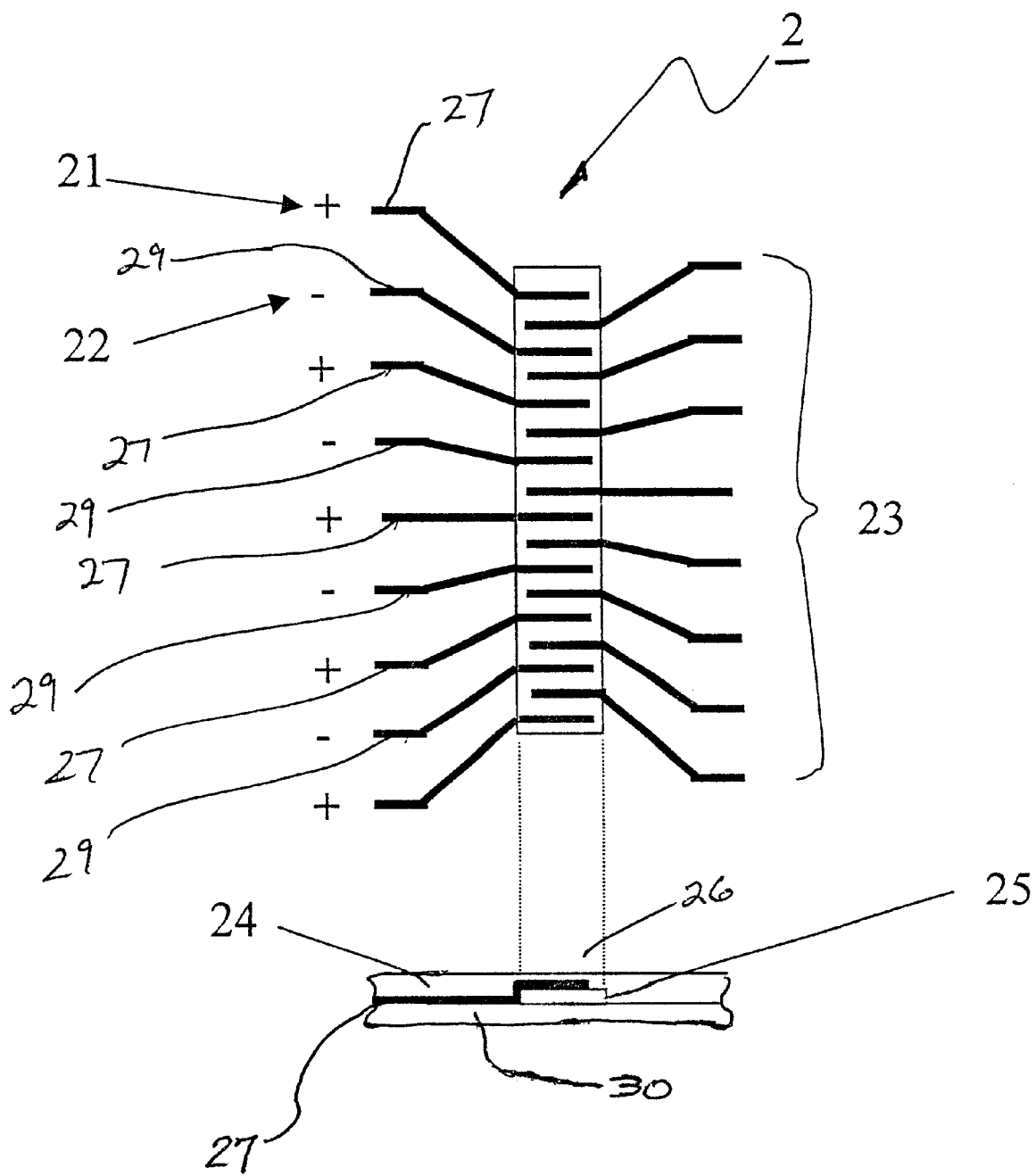
FIG. 2 is a first embodiment of the present invention implemented as one dimensional array.

FIG. 2 shows an embodiment of the fingerprint sensing device 2 of the present invention used for a one dimensional array. On the left side of the figure, alternating positive and negative polarity voltages 21 and 22, respectively, are input to the device 2 via conductors 27 and 29 while the conductor readout lines 23 are positioned on the right side of the figure. The readout lines 23 are disposed in the middle of a pair two voltage conductors, or lines, 27 and 29 such that the background capacitance subtracts out if a uniform surface is placed on the top surface. This construction thus intrinsically detects the finger surface variation only. To prevent the input and output lines from reading parasitic capacitance, the active sensor area is raised by a dielectric spacer 25 (note that the lower part of FIG. 2 is a side elevation view of the device shown in the upper portion of the figure). A thin protective layer 24 of preferably low dielectric constant is disposed on top of the conductors 23, 27 and 29 with a thin layer in the active area 26. This configuration detects finger surface variation along the vertical direction only and requires the user to scan the finger in the horizontal direction.

Device 2 requires only one metal deposition and patterning on the substrate 30 which can be virtually any flat dielectric material, making the whole device extremely economical to manufacture. For an extra measure of caution to prevent parasitic capacitance, a grounded conductive layer can be disposed on top with an opening only over the active area 26.

Figure 3:
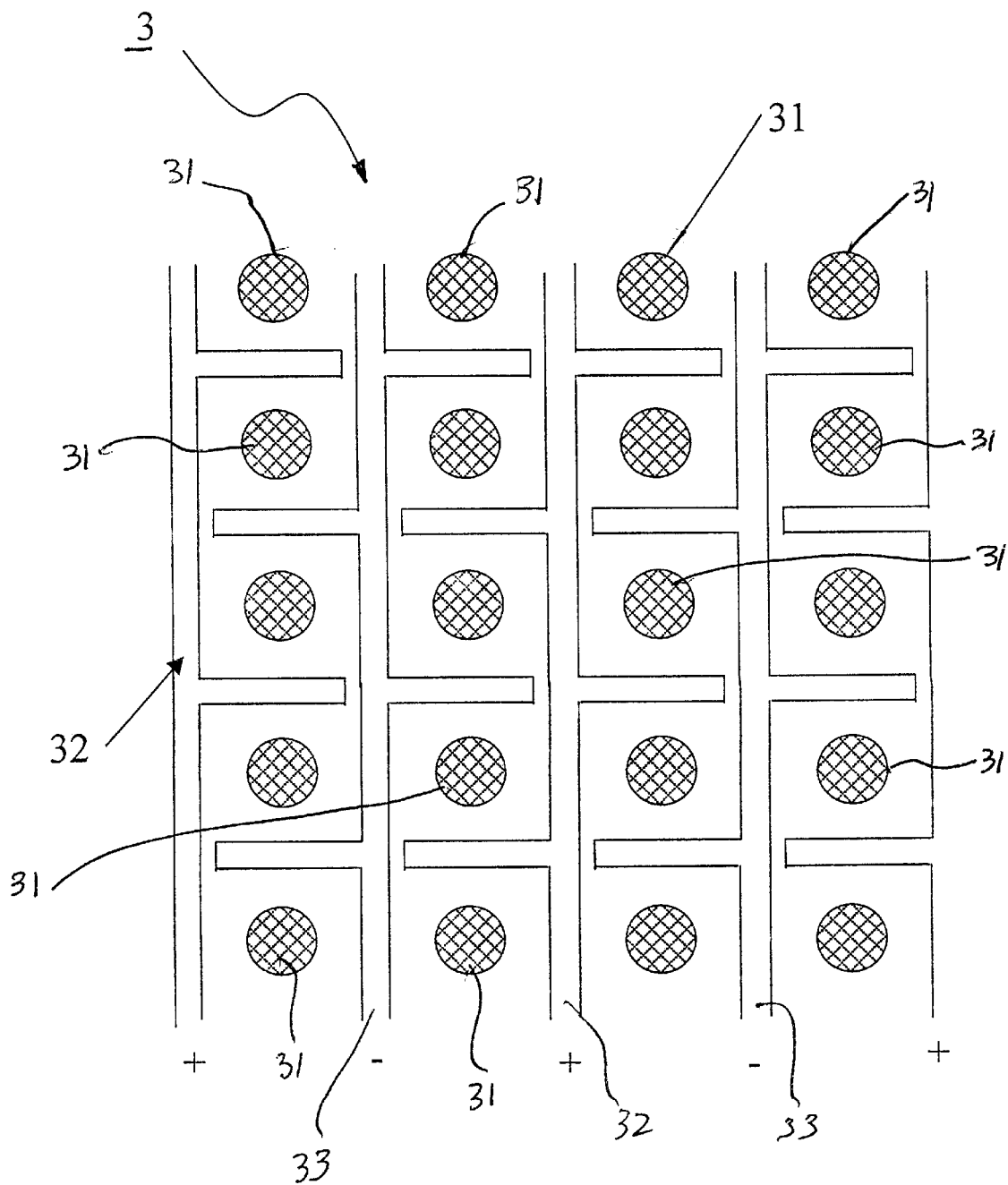
FIG. 3 is a preferred embodiment implemented as a full two dimensional array.

FIG. 3 shows a two dimensional implementation 3 of the present invention. A plurality of pickup, or sensor, electrodes 31 are placed in the center of two opposite polarity voltage lines, or conductors, 32 and 33. The opposite polarity voltage lines are shaped as a comb and are interlocked with the pickup electrodes 31 in between the voltage lines as illustrated. In this embodiment, the user simply places his/her finger on the surface of the sensor array.

Figure 4:
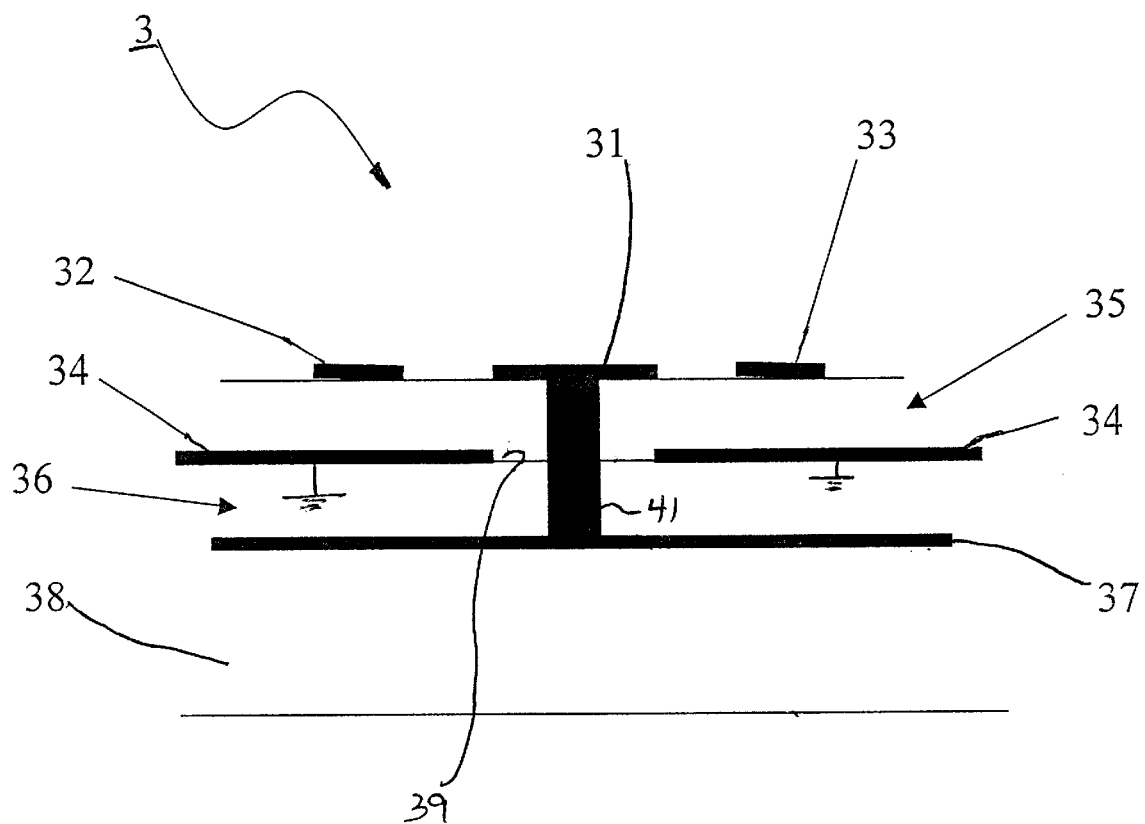
FIG. 4 shows the multi-layer profile of the sensor shown in FIG. 3 in cross-section.

The layer structure of the two dimensional embodiment of FIG. 3 is shown in FIG. 4. The signal which is detected at the metal pickup electrode 31 manifests as a current which flows to the bottom metal electrode layer 37 and is read out from bottom substrate 38 by conventional means (not shown). Grounded intermediate metal layers 34 are provided to shield the readout lines 37 from the fringe fields generated by metal voltage electrodes 32 and 33. A hole 39 is formed between pickup conductor electrode 31 and shielding layer 34 to prevent a short therebetween which would prevent signal pickup by electrode 31. Electrode 31 is connected to readout electrode 37 via metal fill material 41.

Figure 5:
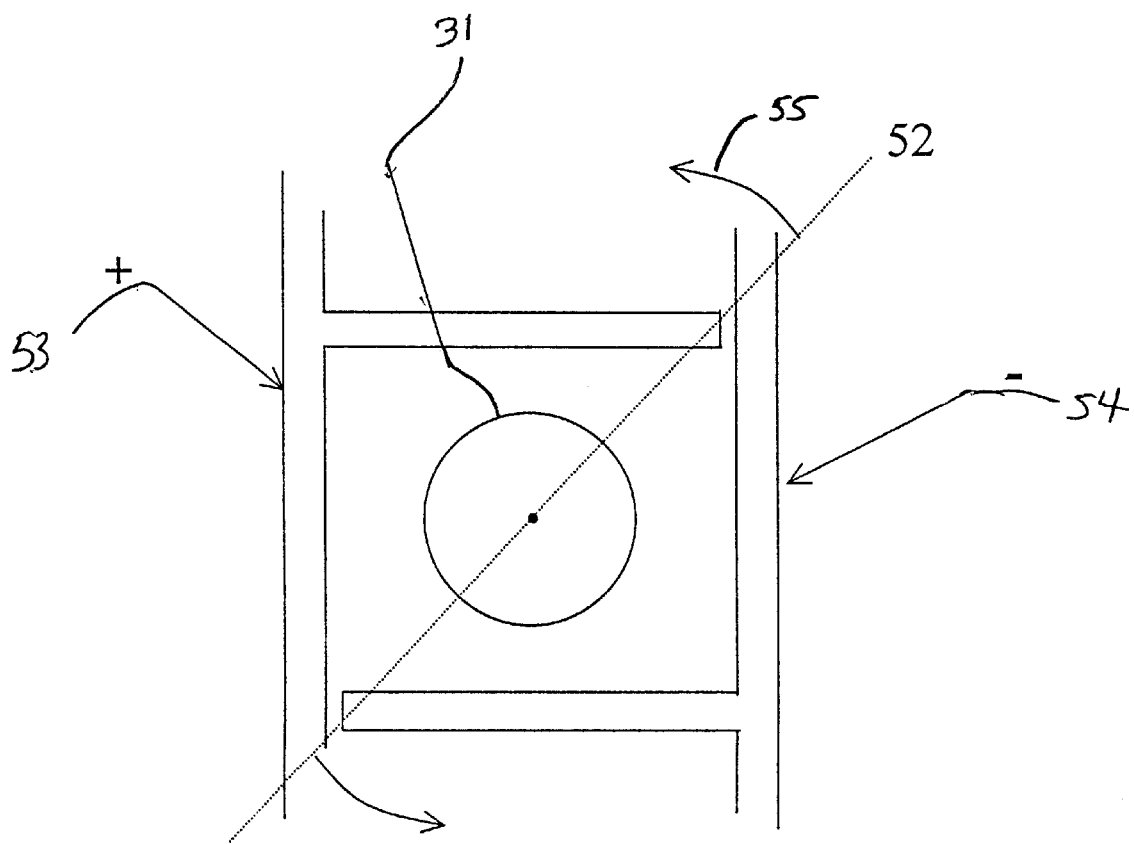
FIG. 5 illustrates the use of all geometric configurations satisfying a criterion.

The two dimensional sensor array shown in FIGS. 3 and 4 satisfies one of the two criteria below. The first criteria is pictorially shown in FIG. 5. The criteria are as follows;

1. If two phase voltages (180° phase angles applied to electrodes 53 and 54) are used, the straight line 52 passing through the center of the pickup electrode 31 must intersect the opposite voltage lines at equal distances at almost any angle. This enables equal and opposite electric field lines to terminate at the pickup electrodes 31 such that the net readout from the pickup electrode 31 is zero when the medium above the electrode is zero, i.e. a user's finger is not positioned on the sensor array (in essence, if the straight line 52 was rotated in the direction of arrow 55, the centerpoint 57 of pickup electrode 31 would be substantially equidistant from the opposite voltage lines 53 and 54).

2. If more than two phase voltages are used (three phase voltvoltages, for example, would have 120° phase angles applied to three different voltage lines), a calculation of the integral of (distance) times (voltage) over all angles would be zero from the origin of the coordinate placed at the center of the pickup electrode.

Figure 6:
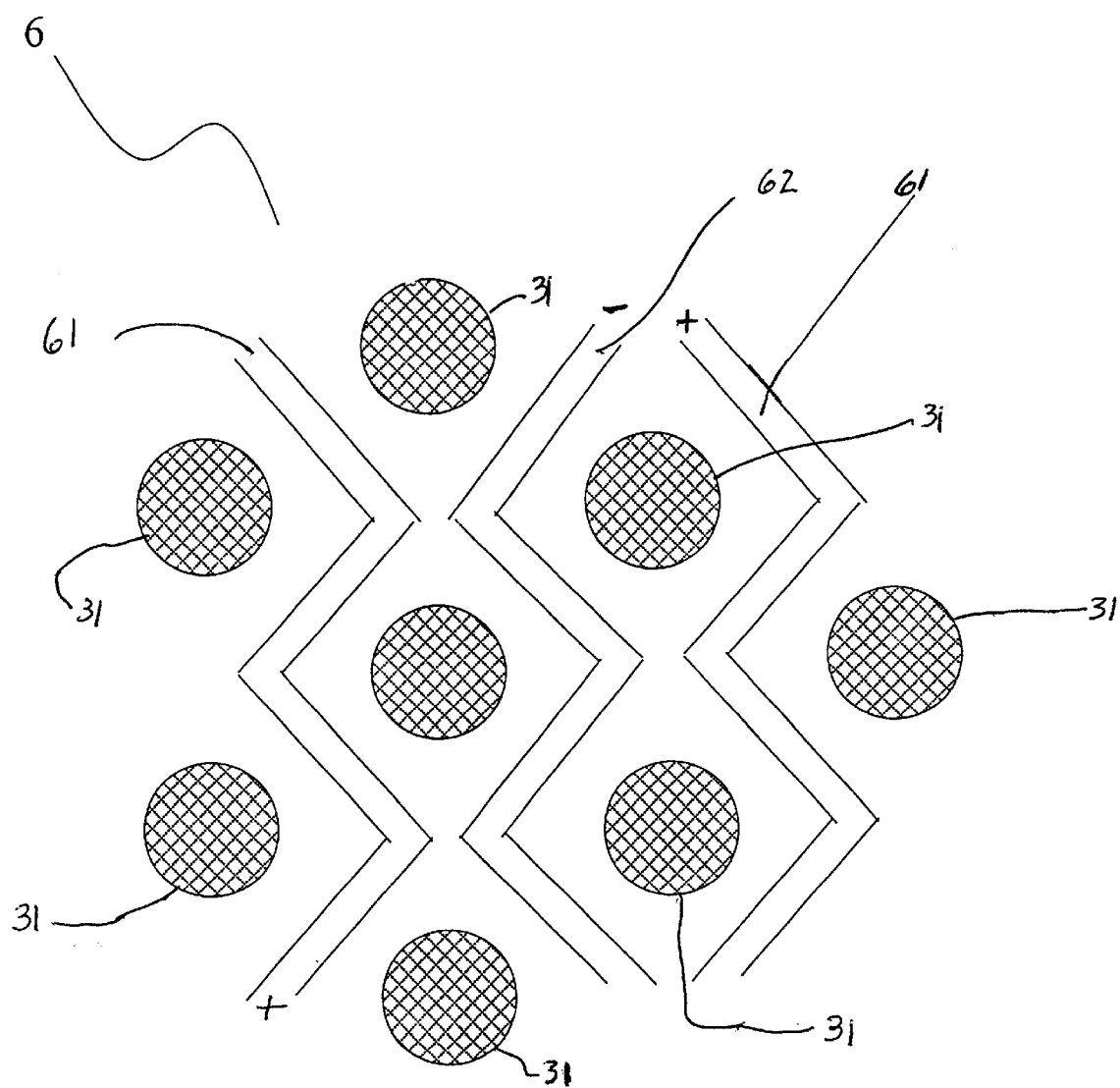
FIG. 6 illustrates another embodiment of the preferred embodiment of the present invention.

In the illustration, the distance is the distance from the center of the pick up electrode 31 to the intersection of the straight line and the electrodes 53, 54. In the first criteria, "almost any angle" is stated because the configuration shown in FIG. 6, for example, where small gaps exist in the chevron patterns of the voltage lines, will work since it is unlikely that the fingerprint ridge lines will run exactly along the narrow region connecting the centers of the pickup electrodes 31. However, if the voltage lines 61 and 62 are straight, the electrodes 31 will not work because all fingerprint ridge lines running along the vertical direction will not be detected, i.e. it becomes a one dimensional sensor. Voltage lines 61 and 62 are equivalent to the hair comb patterns shown in FIG. 3. In essence, these different polarity voltage lines generate electric fields above the surface of the finger surface. The positive and negative field lines terminate at the pickup electrode 31 such that the net readout from the electrode 31 is zero unless there is an irregular surface (i.e. a fingerprint) above which disrupts the field lines. In the case of an irregular surface, the pickup electrode 31 will register some signal (i.e. field lines are not canceled) and a current will flow to the bottom layers for readout.

Figure 7:
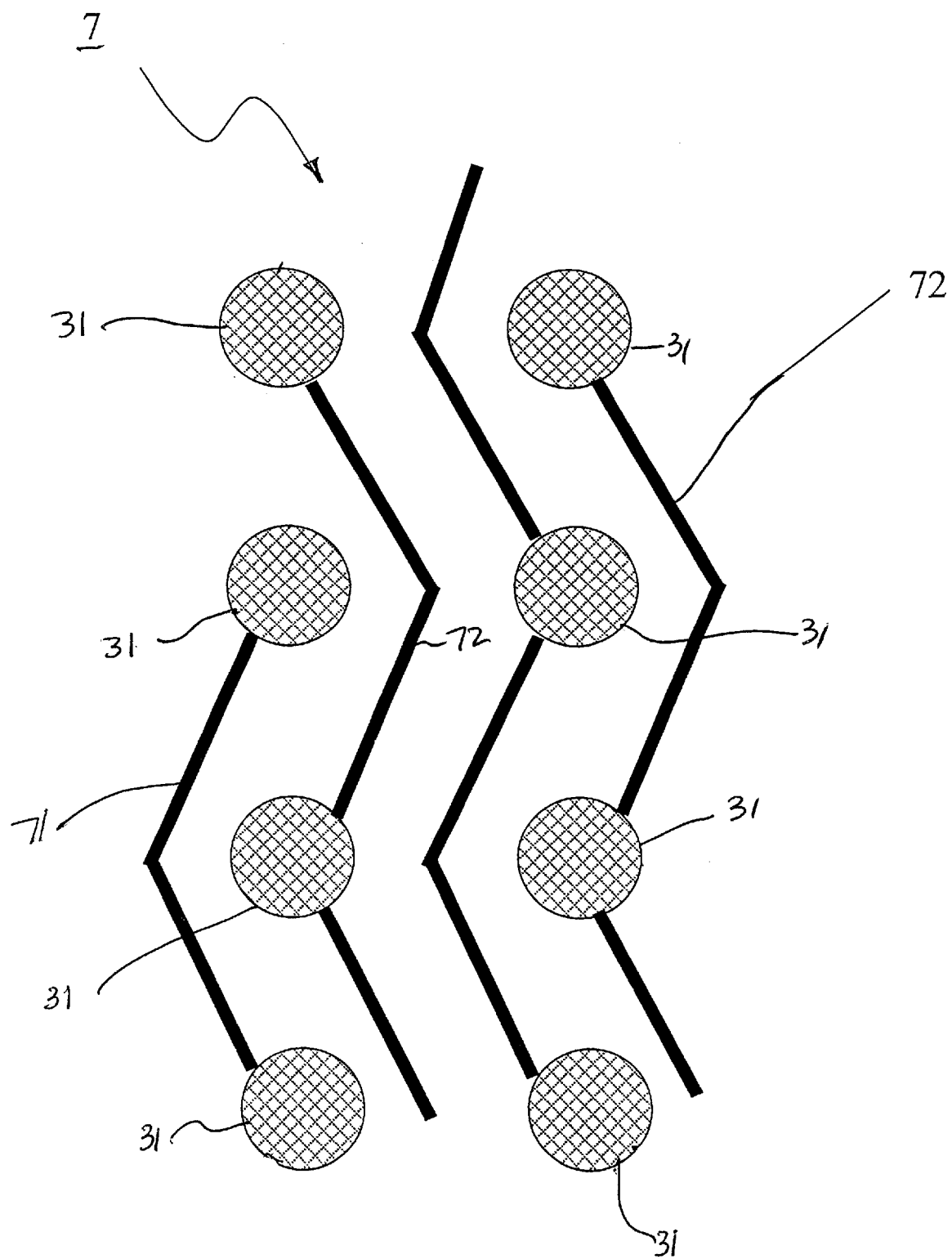
FIG. 7 illustrates a method of picking up the signal electrodes in the bottom layer of FIG. 4 to minimize the inter-pixel cross-talk.

The sensor readout is done much like the external matrix addressing of display devices. Referring to FIG. 4, the readout lines 37 are disposed in the orthogonal direction from the electrode lines 32 and 33. At any given time, only the nearest one pair of opposite polarity voltage lines are activated while the appropriate readout line is interrogated. In this way, a row is read out one at a time, and the voltage lines are scanned down in pairs to read the whole array. The whole readout process takes a short time, typically a fraction of a second. Therefore, there is no need for a complex circuitry for every pixel, and the sensor array can be manufactured with three metal deposition and patterning. In order to reduce the cross talk between the nearest pixels, the readout lines 71 and 72 can connect every other pickup electrodes 74 as shown in FIG. 7. FIG. 7 illustrates how the signal electrodes can be connected in the bottom layer 37 (FIG. 4). Conductive lines 72 terminate at the edges of the fingerprint sensor where readout driver chips are connected.

The present invention thus provides a relatively simple and cost effective capacitive circuit array for sensing fingerprints.

While the invention has been described with reference to its preferred embodiments, it will be understood by those skilled in the art that various changes may be made and equivalents may be substituted for elements thereof without departing from the true spirit and scope of the invention. In addition, many modifications may be made to adapt a particular situation or material to the teachings of the invention without departing from its essential teachings.

What is claimed is:

1. An electronic fingerprint sensor array comprising a plurality of pickup and voltage electrodes formed on the top surface of said sensor array, the electrodes being formed in a two dimensional pattern; means for applying voltages to said plurality of voltage electrodes in a predetermined manner such that equal and opposite electric field lines terminate at the pickup electrodes such that the net voltage readout from said pickup electrode is substantially zero in the absence of a user fingerprint applied to said top surface of said sensor array, the alternating opposite polarity voltages being simultaneously applied to said voltage electrodes, said voltage and pickup electrodes being configured such that a straight line passing through the center of said pickup electrodes intersects the two opposite voltage electrodes at a substantially equal distance from said center.

2. The electronic fingerprint sensor array of claim 1 wherein said sensor is comprised of three layers of conductor patterns, insulators being formed between said conductive layers, the top most conductive layer being in a two dimensional array of electrodes, the second conductive layer comprising a grounded conductive layer with holes below said signal pickup electrodes so as to prevent short circuits, the third conductive layer comprising signal readout lines, and conductive members for connecting said signal pick up electrodes on said top surface to said signal readout lines in said third layer.

3. The electronic fingerprint sensor array of claim 2 wherein each of said electrode arrays comprises two voltage electrodes having opposite polarity voltages applied thereto and one pickup electrode disposed between said two voltage electrodes.

4. An electronic sensor array comprising an array of electrode patterns formed on the top surface thereat formed in one dimension, each of said electrode patterns comprising two electrodes having opposite polarity voltages applied thereto and one pickup electrode disposed between said two voltage electrodes, said pickup electrode and said two voltage electrodes being configured such that a straight line passing through the center of said pickup electrode intersects the two opposite voltage electrodes at a substantially equal distance from said center.

* * * * *